United States Patent [19]
Morse

[11] Patent Number: 5,260,525
[45] Date of Patent: Nov. 9, 1993

[54] PANEL ASSEMBLIES

[75] Inventor: Jeffrey L. Morse, North Easton, Mass.

[73] Assignee: Alan Eckel, Westford, Mass.

[21] Appl. No.: 816,464

[22] Filed: Jan. 3, 1992

[51] Int. Cl.$^5$ ............................................. E04B 1/00
[52] U.S. Cl. ................................... 181/285; 181/287; 181/290; 52/272
[58] Field of Search ............... 181/284, 285, 286, 287, 181/288, 296, 290; 52/272, 284, 288, 582, 584

[56] References Cited

U.S. PATENT DOCUMENTS

| | | | |
|---|---|---|---|
| 4,038,796 | 8/1977 | Eckel | 52/584 X |
| 4,074,489 | 2/1978 | Eckel | 52/272 |
| 4,106,255 | 8/1978 | Eckel | 52/582 |

Primary Examiner—Michael L. Gellner
Assistant Examiner—Khanh Dang
Attorney, Agent, or Firm—Pandiscio & Pandiscio

[57] ABSTRACT

Various improvements of a modular wall assembly of the type having panels with channels formed along the side edges of the panels are described. The improvements include the formation of at least the channels, and the surface of the panels adjacent to the closed ends of the channels, of a material resistant to the passage of electrical radiation. Connection assemblies are provided for the joinder of adjacent panels located either in the same plane or in intersecting planes which include elements which continue the electrical radiation barrier of the panel surface and channel across the joint. The connection assemblies provide structural strength to the modular wall assembly, facilitate the creation of acoustically and electrical radiation resistant enclosures, and allow the removal of individual panels from the assembly for inspection and/or replacement without substantial effect upon the remainder of an enclosure structure. The panels and the connection assemblies are also acoustically insulated.

27 Claims, 3 Drawing Sheets

PANEL ASSEMBLIES

FIELD OF THE INVENTION

The present invention relates to panel assemblies. More particularly, the invention relates to panel assemblies of the modular type.

BACKGROUND OF THE INVENTION

Modular acoustical panel assemblies are well known for providing sound absorbing and attenuating walls, ceilings and floors which are easy to construct and build with a minimum of effort and skill.

For example, in U.S. Pat. Nos. 4,038,796 (the '796 patent); 4,074,489 (the '489 patent); and 4,106,255 (the '255 patent), improved acoustical modular panel assemblies are described which are easily and quickly assembled and disassembled without the need for specialized tools. Each of these assemblies includes a plurality of identical modular panels which are adapted to be assembled together to form the desired room element (e.g. wall). In assembling the panels together to form a flat wall, each panel is aligned and oriented with respect to an adjacent panel so that the side edges of the respective panels are in confronting and spaced relationship. Each panel includes a substantially flat body and at least one tongue which extends along a side edge of the panel substantially parallel to and spaced from the body so as to form a channel therebetween which is open along one side of the panel. In the '255 patent, the tongue is provided with a flange portion which extends from the tongue away from the channel.

The panel assemblies described in each of these patents also include connector means for connecting the panels together in an acoustically tight manner. These connector means include two preferably U-shaped connector members, each comprising two substantially parallel side plates and a web or strap connected to and supporting the side plates. The first connector is located such that its web or strap spans the gap between the open ends of the two opposing end channels of two adjacent panels, and its parallel side plates extend respectively into one or the other of the channels in a tight fitting relationship therewith. The web or strap of the first connector thereby acts as the bridging element between the adjacent panels. The second connector, on the other hand, is located within the gap between the two opposing end tongues of the two adjacent panels, such that its two parallel side plates bear against the adjoining tongues and its web or strap spans the distance between the closed ends of the two opposing end channels of the two adjacent panels. These connectors may be maintained in place by either the frictional/resilient engagement of the parts, or by mechanically removably affixing the connectors together.

Various connector configurations are also disclosed for connecting the side edges of panels whose side surfaces are aligned and oriented at a right angle, so that the panels can form a corner. One such connector comprises a body having a substantially L-shaped cross-section wherein both legs of the L have a thickness corresponding to the thickness of the adjacent flat panels. The corner is then formed by inserting the respective legs of the L-shaped connector into one or the other of the two end channels of the two adjacent panels.

The advantages and disadvantages of panel assemblies of the type just described are well known. The modular nature of the panels facilitates assembly and disassembly, and reduces costs. The connectors provide structural integrity, a vertical load bearing column between each pair of panels, and a raceway between panels for the accommodation of plumbing lines, electrical cables, communication lines, and the like. Also, the sound absorption and attenuation achievable with modular wall constructions of the types just described is generally good.

The joints between the acoustic panels are not totally sealed, however, so the structure cannot be categorized as totally sound proof. In addition, rooms constructed of such panels tend to provide little barrier to electrical radiation entering or exiting the room. Unfortunately, however, many applications exist wherein a barrier substantially impervious to both sound and electrical radiation, particularly in the radio frequency range, is required. For example, numerous very delicate medical procedures require the maintenance of a sound free environment and an electrical radiation free environment, so that sensitive measuring devices can function without any outside sound and/or electrical radiation interference. Similarly, in some situations where information security is of great importance, it is desirable to provide an enclosure in which activities may take place without fear of outside observation or detection of the actions, sounds, or electronic activities occurring within the enclosure. In the latter situation, it is also generally important that the walls, ceilings and floors making up the enclosure be suited for periodic inspection, so as to be able to assure the absence of sound and/or electrical listening devices within or adjacent to the walls, ceilings and/or floors.

OBJECTS OF THE INVENTION

Accordingly, it is an object of the present invention to provide a modular wall assembly which presents a barrier which is substantially impermeable to both sound and electrical radiation.

It is also an object of the present invention to provide a modular wall assembly including an improved corner connecting means for joining adjacent wall portions.

Further, it is an object of the present invention to provide a sealing gasket for use in connecting adjacent wall panel modules which has sound insulating characteristics and is resistant to the passage of electrical radiation.

Still further, it is an object of the present invention to provide a lightweight, easy to assemble modular wall assembly which is both acoustically insulating and resistant to the passage of electrical radiation.

Still further, it is an object of the present invention to provide an acoustically insulating/electrical radiation resistant modular wall assembly which is readily adaptable to the formation of a sound and electrical radiation resistant enclosure.

Still further, is it is an object of the present invention to provide an acoustically insulating/electric radiation resistant enclosure wherein the individual panels making up the enclosure are readily and easily removable for inspection without significant disassembly of the remainder of the enclosure structure.

SUMMARY OF THE INVENTION

These and other objects of the invention are accomplished by the provision of at least two modular panels of the type described above with respect to the '255 patent, i.e., including a substantially flat body and a tongue extending substantially parallel to and spaced from at least one edge of the body so as to form a channel therebetween. The tongue is also provided with a flange extending away from the channel. The panels are filled with sound absorbing material, and at least the tongue, the flange and the surface of the panel adjacent the closed end of the channel are made of electrical radiation resistant material. Adjacent panels of the same wall are joined substantially as described in the '255 patent, i.e., by a first substantially U-shaped connector having two side plates which extend into corresponding channels of the aligned adjacent panels, and by a second substantially U-shaped connector disposed between the tongues of the adjacent panels, the first and second connectors being releasably secured together so as to clamp the flange portions of the adjacent panels therebetween. A sound/electrical radiation resistant gasket is located between the flanges and the first connector to assure the continuous resistance of the wall assembly to sound and electrical radiation in the area of the joint.

Further, an improved corner connection assembly is provided for connecting two adjacent modular panels of the type just described which are aligned and oriented at an angle to each other, with their corresponding tongue bearing edges facing the intersection of the planes containing the panels. The corner connector assembly includes a third connector having a body portion located substantially at the intersection of the above planes, and a pair of fourth connectors each having a substantially L-shaped cross-section. The third connector also includes first and second surfaces respectively engaging the lower surfaces of one or the other of the flanges. The fourth connectors are located with one leg of their L-shaped cross-section extending into a channel on one of the panels and their other leg bearing against, but extending beyond, the upper surface of the corresponding flange. The portions of the fourth connectors residing adjacent the flanges are releasably affixed to the corresponding first and second surfaces of the third connector, thereby completing the corner joinder of the panels. A sound/electrical radiation resistant gasket is located between the flanges and the fourth connectors of the respective joints. Further, an electrical radiation resistant corner shield is mounted between the first and second surfaces of the third connector by flanges clamped between the respective surfaces and the fourth connector members.

It is contemplated that given the preferred embodiments of the invention disclosed herein, it will be readily possible for those skilled in the art to construct sound and/or electrical radiation resistant walls and enclosures from modular components. In particular, the concepts and practices of the present invention will be seen to be readily integrable into a total construction concept without departure from the present invention in its broadest aspects, as will more fully hereinafter appear.

BRIEF DESCRIPTION OF THE DRAWINGS

Other features, and many attendant advantages of the present invention, are disclosed in, or will be rendered obvious to those skilled in the art from, the following detailed description of a preferred embodiment of the invention, which is to be considered in conjunction with the accompanying drawings in which.

DETAILED DESCRIPTION OF THE INVENTION

Figure 1:
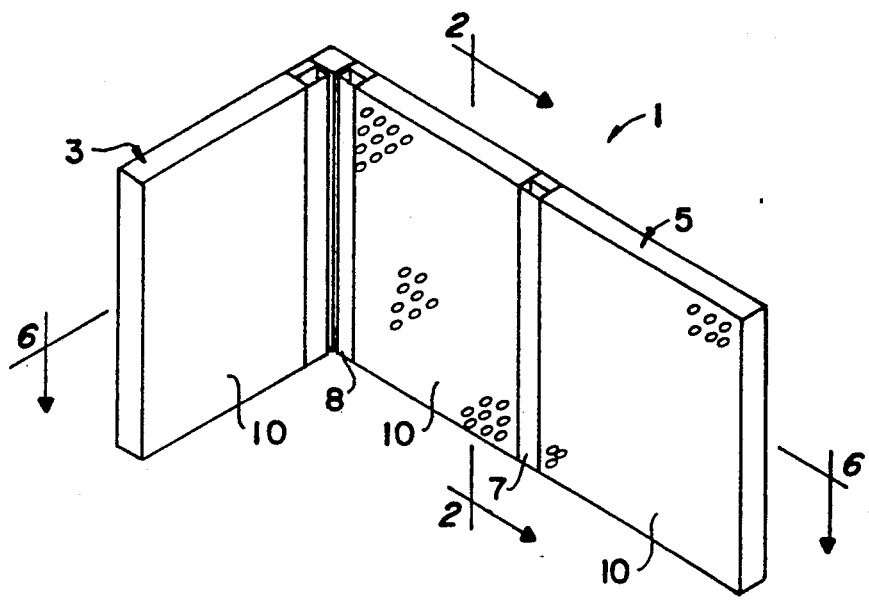
FIG. 1 is a fragmentary perspective view of a panel assembly made in accordance with the present invention, including a corner whereat two flat wall sections meet.

Referring now specifically to the drawings in which like reference numerals refer to like elements throughout, and particularly to FIG. 1, a modular panel assembly in accordance with the present invention is representatively shown at 1. In this assembly, a flat wall section 5 including two panels 10 coupled by joinder means 7, and a flat wall section 3 including a single panel 10 are shown joined at an angle to each other by corner connecting means 8. It is to be understood that the flat wall sections of the present invention may include one or more identical panels without departure from the present invention.

Figure 2:
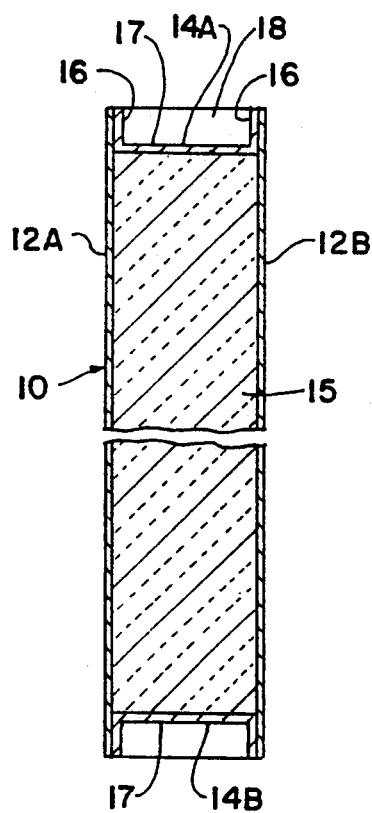
FIG. 2 is a fragmented plan sectional view taken along the line 2—2 of FIG. 1.

As best seen in FIG. 2, each of the identical panels 10 includes a pair of flat plates 12a and 12b mounted in parallel spaced apart relation so as to form a substantially flat body. While both plates may be solid and made from the same material, it is preferred that plate 12a be perforated so as to reduce its weight and so as to render it transparent to sound, and that it be made of a lightweight material such as aluminum. Plate 12b, on the other hand, is solid and made from a material resistant to electrical radiation such as galvanized steel.

The top and bottom longitudinal edges of the plates 12a and 12b are secured together by stiffeners 14a and 14b respectively. Each stiffener has a body portion 17, a pair of side flanges 16 which are secured to the inside surfaces of plates 12a and 12b, and end flanges 18 which extend transversely to and are spaced from the side flanges 16 so as to provide a relief (not shown) at each corner of the stiffener. It will be understood that the body portion 17 of the stiffeners 14a and 14b may be recessed with respect to the adjacent edges of the plates 12a and 12b as shown in FIG. 2 or, alternatively, may be located in the same plane with those edges without departure for the invention. The stiffeners are made of lightweight material such as aluminum.

Side walls 20a and 20b (best seen in FIG. 6), also made of lightweight material such as aluminum or light gauge steel, are located between plates 12a and 12b and between stiffeners 14a and 14b. Flange portions 21a and 21b extend inwardly form the opposing longitudinal edges of each of the side walls 20a and 20b and are attached to the inner surfaces of plates 12a and 12b. Walls 20a and 20b also are attached to stiffeners 14a and 14b. It has been found that the securement of plates 12a and 12b to the stiffeners 14a and 14b, and to the flanges 21a and 21b of the side walls 20a and 20b, is conveniently accomplished with acoustically insulative foam tape 122 having adhesive on both sides; however, any convenient means of securement may be utilized without departure from the present invention. Thus, for example, in the situation where plate 12b is formed out of galvanized steel and side walls 20a and 20b are formed out of light gauge steel, side walls 20a and 20b may be welded to plate 12b. The volume defined by plates 12a and 12b, side walls 20a and 20b, and stiffeners 14a and 14b is filled with sound absorbing material 15, e.g. glass wool, mineral wool, or plastic foam.

Plate 12b (see FIG. 6) includes at least one side, right angle extension 22, hereinafter referred to as a "tongue 22". Each tongue 22 extends along the adjacent side edge of the panel and is spaced from the adjacent side wall 20a or 20b so as to form an open channel 24 therebetween. Each tongue 22 also is provided with a flange portion 26 having a predetermined width and extending substantially perpendicular to the tongue.

Figure 3:
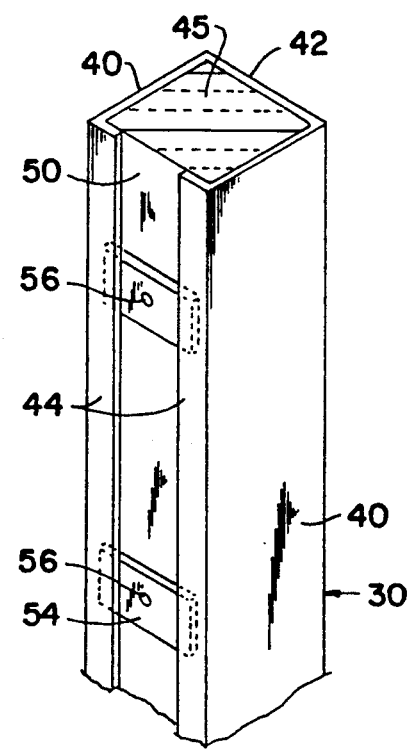
FIG. 3 is a fragmented perspective view of a portion of the connecting means employed in the creation of the flat wall portion of the assembly shown in FIG. 1.

First and second connectors 28 and 30 are provided substantially as shown and described in the '255 patent referred to above for the formation of joints between panels in the construction of flat walls. The first connector 28 (best seen in FIG. 6) is a generally U-shaped channel having a pair of spaced parallel plates 32 and 34 engaging the open channels 24 of the adjacent panels 10, and a web or strap 36 connecting the plates 32 and 34. The first connector 28 is formed of a electrical radiation resistant material similar to that used for plate 12b. The second connector 30 (best seen in FIGS. 3 and 6) is also a generally U-shaped channel having a pair of spaced parallel plates 40 connected by a web or strap 42, wherein the outer edges of the plates 40 include inwardly extending opposing flanges 44. The second connector 30 is located in a snug fit between the outer surfaces of the tongues 22 of the adjacent panels 10, with its inwardly extending flanges 44 bearing against the lower surfaces of the outwardly extending flanges 26 of the respective tongues 22. The interior of the second connector 30 is filled with a sound absorbing material 45 similar to that filling the panels 10, and the connector itself is preferably formed of a lightweight material such as aluminum.

A two part gasket 46 (best seen in FIG. 6) is located between the outwardly extending flanges 26 and the inner surface of the web 36 of the first connector 28. The gaskets 46 extend substantially the entire length of the flanges 26 and include a strip 48 of sound absorbing foam, preferably a closed cell foam made of neoprene, urethane or rubber, bordered on its edges 49 with a strip 50 of metal mesh having a thickness at least as great as that of the foam strip. The metal mesh is highly conductive and may conveniently be composed of a zinc steel alloy. Gaskets 51a and 51b of sound insulative material such as rubber may be located at the bottom of the channels 24 so as to engage plates 32 and 34 to further insulate the joint against sound leakage.

The first and second connectors 28 and 30 are releasably connected to each other in the area between the flanges 26, for example by bolt 52 extending through the web portion 36 of the first connecting member 28, and the gaps between the flanges 26 of the adjacent panels 10, and the flanges 44 of the second connecting member 30, to threadingly engage a retention member 54 extending between the plates 40 immediately below the flanges 44, with retention member 54 being provided with an opening 56 to receive the ends of bolts 52.

Further, as was the case with the '255 patent referred to above, the tongues 22 may extend upwardly along the adjoining sides of the panels 10 only a portion of the height of those sides, with the first and second connectors 28 and 30 being sized accordingly. In this manner, channels 200 may be created on the inner side of the wall assembly 1. These channels may act as a raceway for electrical, communication, plumbing or similar lines. They also provide a recess for containing the attachment means for the joinder, i.e., the bolts, thereby providing security from outside tampering with the barrier. The appearance of a solid barrier may also be maintained in the latter alternative by providing a lightweight cover schematically shown at 202 for the channels 200.

It will be understood by those skilled in the art that the wall assembly just described provides both a continuous barrier to electrical radiation and improved sound absorption joint characteristics. Specifically, the plate 12b of each panel 10 extends directly and continuously to form the tongues 22 and the flanges 26. The flanges 26 in turn are connected to the first connector member 28 by the metal mesh portion 50 of the gaskets 46 to create a continuous radiation barrier. The gaskets 46, 51a and 51b, along with the sound absorptive material 45 contained within the second connector 30, act to improve the acoustically insulative properties of the joint. To the extent that the connection of the first connector 28 to the second connector 30 by bolt 52 may create leaks in this barrier, those leaks are not believed to be significant. This is because the direct metal to metal contact of the head of the bolt 52 with the outer surface of the first connector 28 effectively seals the opening through which the bolt passes.

The creation of an enclosed space protected from both sound and radiation leaks, however, requires an effectively sealed corner joint as well.

The present invention provides such a corner joint. Specifically, to connect two panels 10 at an angle to one another so as to form a corner between them as representatively shown in FIG. 1, a corner assembly 8 is provided which includes a third connector 60 and a pair of fourth connectors 62a and 62b.

Figure 4:
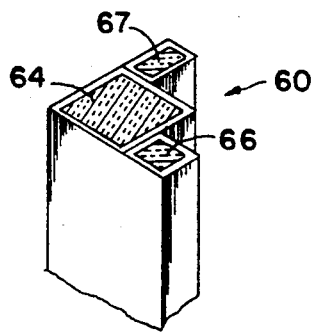
FIG. 4 is a fragmented perspective view of a corner connection member suitable for use in the present invention.
Figure 6:
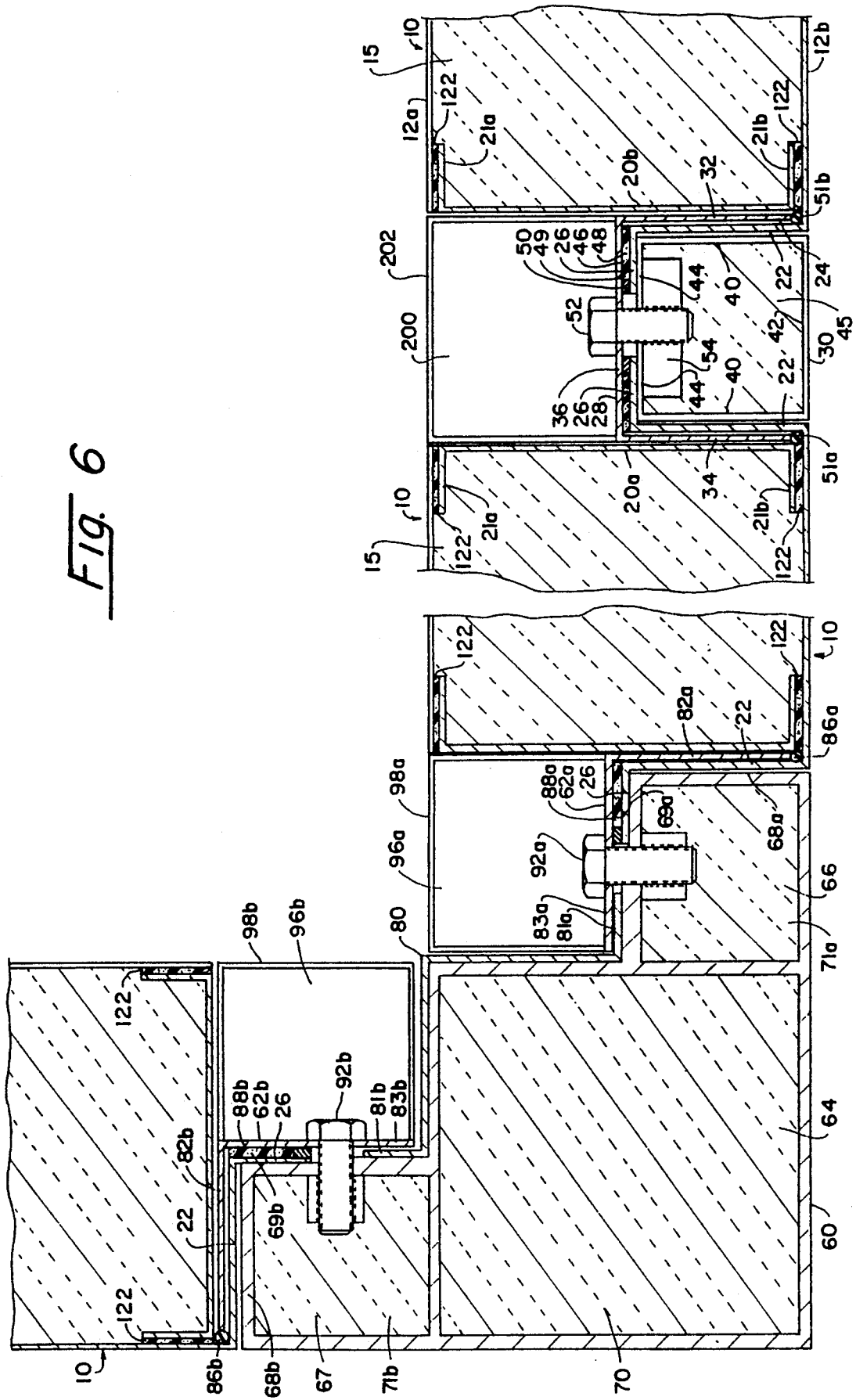
FIG. 6 is a fragmented sectional view of the panel assembly of FIG. 1 taken along the line 6—6.

Connector 60, best seen in FIGS. 4 and 6, includes a body portion 64 and support portions 66 and 67 extending outwardly from the body portion toward each of the adjacent panels 10. Support portions 66 and 67 each include an outer bearing surface 68a and 68b, respectively, adapted to bear against the outer surface of the tongue 22 of one of the panels 10, and an inner bearing surface 69a and 69b respectively, normal to the adjacent outer bearing surface 68a or 68b and having a width substantially greater than the predetermined width of the flange 26. In the preferred form of the invention illustrated in the drawings, body portion 64 is an elongated hollow member having a substantially square cross-section which is filled with sound absorbing material 70. Support portions 66 and 67 are also elongated, hollow, square in cross-section, and filled with sound absorbing materials 71a and 71b, respectively. Support portions 66 and 67 extend at a right angle to each other, projecting outwardly from the body portion 64 next to opposing diagonal corners of its cross-section. The walls of body portion 64 and support portion 66 preferably are made of a lightweight material such as aluminum.

Figure 5:
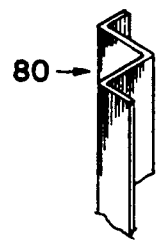
FIG. 5 is a fragmented perspective view of a representative radiation shield suitable for use with the corner connector shown in FIG. 4.

A shield 80 (best seen in FIGS. 5 and 6) of material resistant to electrical radiation, e.g. galvanized steel, mates with the exterior surface of the body portion 64 between the inner bearing surfaces 69a and 69b of the supports 66 and 67. Shield 80 includes flanges 81a and 81b extending outwardly therefrom toward the flanges 26 of the adjacent panels 10.

The pair of fourth connectors 62a and 62b, each including a pair of plates, 82a and 82b, and 83a and 83b, respectively, and defining a substantially L-shaped cross-section, complete the assembly. These connectors are located such that plates 82a and 82b respectively substantially fill the channels 24 on the edges of the panels 10 adjacent to the third connector 60. The other plates 83a and 83b of the fourth connectors 62a and 62b extend along the upper surface of the adjacent flanges 26 and thence toward the body portion 64, over flanges 81a and 81b of the shield 80. Gaskets 86a and 86b of sound absorbing material are located at the bottom of each channel 24 to engage plates 82a and 82b, respectively, and sound absorbing/electrical radiation resistant gaskets 88a and 88b of the type described above are located between the flanges 26 of the adjacent panels 10 and the corresponding fourth connecting member 62a or 62b. Releasable attachment means join the fourth connecting members 62a and 62b to the support portions 66 and 67. Bolts 92a and 92b have been found to be satisfactory for this purpose.

Further, as was the case in the '255 patent referred to above, the tongues 22 may extend upwardly along the adjoining sides of the panels 10 only a portion of the height of those sides, with the supports 66 and 67 being sized accordingly. In this manner channels 96a and 96b may be created on the inner side of the wall assembly 1. These channels may act as a raceway for electrical, communication, plumbing or similar lines. They also provide a recess for containing the attachment means for the joint, i.e., the bolts, thereby providing security from outside tampering with the barrier. The appearance of a solid barrier also may be maintained in the latter alternative by providing a lightweight cover schematically shown at 98a and 98b for the channels 96a and 96b.

It will be understood by those skilled in the art that the corner assembly just described provides the same sort of sound and radiation barrier as the flat wall joint described previously. The radiation barrier extends from the plate 12b of one panel through the tongue 22 and flange 26 adjacent to that panel and thence through the metal mesh portion of the gaskets 88a and 88b to the shield 80. Thereafter the barrier continues in reverse order to the plate 12b of the other panel. Sound leakage is also reduced in a manner similar to that described previously in this application.

Figure 7:
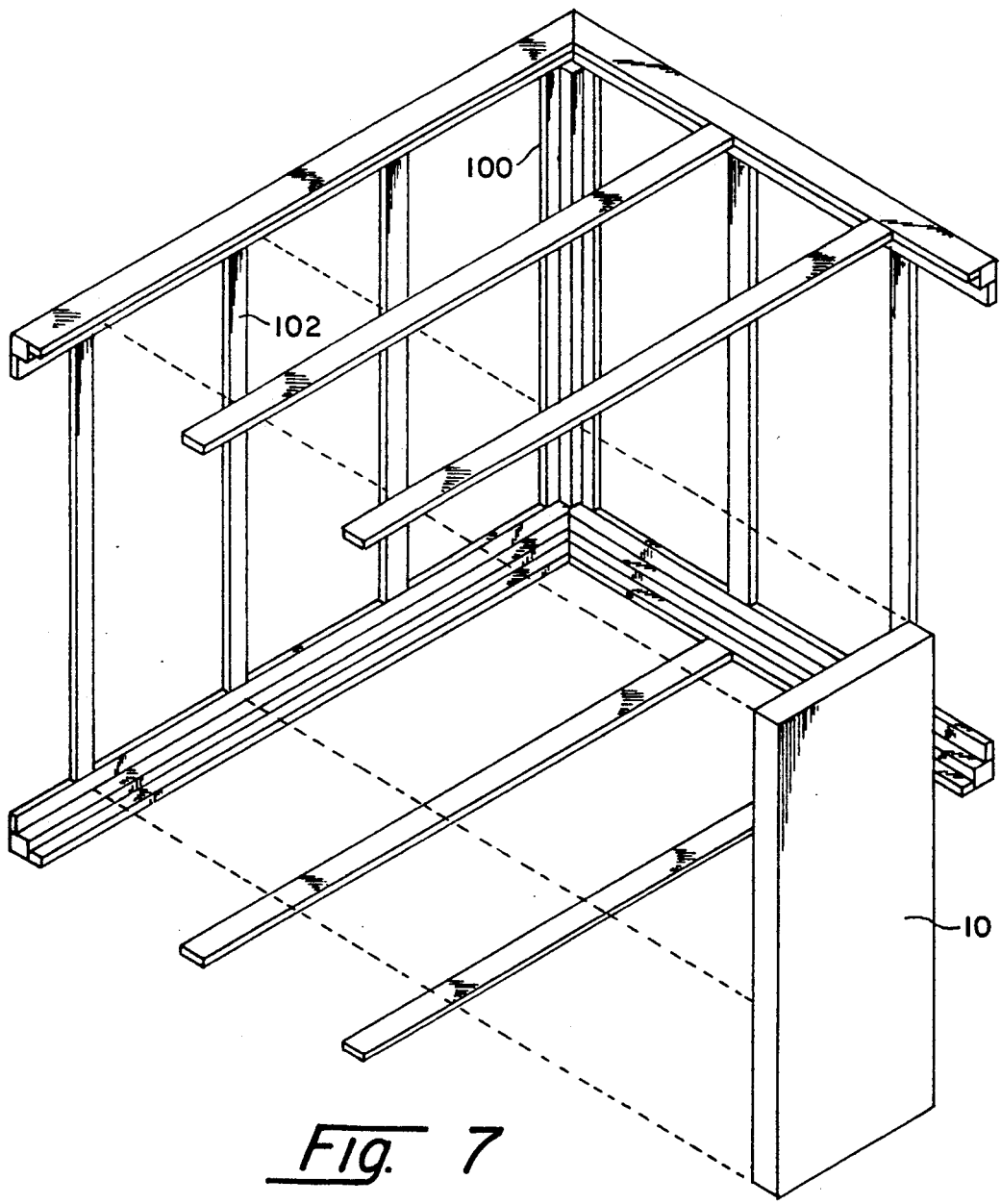
FIG. 7 is a partially exploded perspective view of an enclosure utilizing the panel assembly of the present invention.

Given the foregoing, those skilled in the art further will understand that the modular panel assembly illustratively disclosed herein lends itself to numerous configurations and usage contexts. For example, an entire enclosure including not only walls, but also ceiling and floor, may be constructed utilizing the present invention. Further, this may be accomplished easily while retaining the ability to remove individual panels without disturbance to the remainder of the structure. FIG. 7 is illustrative of the latter concept. An enclosure is there shown including a framework of twelve edge beams 100 arranged to form a cube, and a plurality of surface beams 102 located at intervals between the various pairs of edge beams 100. This form of framing for an enclosure is common in the construction arts and will be easily understood by workers who otherwise are unfamiliar with modular assemblies. By providing edge beams 100 with the cross-sectional configuration of the body portion 64 and support portions 66 and 67 of the above described corner assembly, and by providing the surface beams 102 with the construction indicated for the second connector members 30, and further providing each panel 10 with a channel 24 as described herein adjacent both of its sides and both of its ends, the assembly of a secure acoustic and electrical radiation resistant enclosure is much simplified. Specifically, each panel 10 need only be placed in the space between adjacent pairs of support members 100 and/or 102, and thereafter connected to them and the panels adjacent thereto in the manner herein described, to them to complete the assembly. In such an assembly, the only radiation leakage will be at the corners where three planar surfaces come together. These corners are easily sealed with electrically conductive putty or the like. Also, since lightweight materials are used for the entire framework and for as much of the panel and joint assemblies as possible, transportation of the enclosure and its erection are simplified and costs are significantly reduced.

Therefore, the foregoing description of a preferred embodiment of this invention should be taken as illustrative only, and in no way limiting. Various modifications, improvements, alterations and the like will occur to those in the art which are within the contemplation of the invention in its broadest aspects. Accordingly, it is intended that the present invention be limited and defined only by the accompanying claims.

What is claimed is:

1. A modular panel assembly comprising in combination:

at least two panels each including a substantially flat body, said flat bodies being aligned and oriented in intersecting planes such that a side edge thereof faces and is spaced form the intersection of said planes, a tongue at at least said side edge of each said flat body, each said tongue extending substantially parallel to and spaced from said side edge of its associated body so as to form a channel therebetween, and a flange portion carried by each said tongue, each said flange extending a predetermined distance away form its associated channel and having an upper surface and a lower surface;

a first connector having a second body portion located substantially at the intersection of said planes, and defining a first surface and a second surface, said first surface engaging the lower surface of one of said flanges and said second surface engaging the lower surface of the other of said flanges, said first and second surfaces having a width greater than said predetermined distance;

a second connector having a substantially L-shaped cross-section including a first plate portion extending within said channel associated with one of said panels so as to make a snug fit with the adjacent tongue and body of said one of said panels, and a second plate portion extending from said first plate portion over said flange of said one of said panels, said second plate portion having a width substantially greater than said predetermined distance, but less than the width of said first surface;

a third connector having a substantially L-shaped cross-section including a third plate portion extending within said channel associated with the other of said panels so as to make a snug fit with the adjacent tongue and body of the other of said panels, and a fourth plate portion extending from said third plate portion over the flange of the other of said panels, said fourth plate portion having a width substantially greater than said predetermined distance, but less than the width of said second surface;

first means associated with said second plate portion and said first surface for releasably securing said second plate portion and said first surface together so as to clamp said flange of said one of said panels therebetween; and second means associated with said fourth plate portion and said second surface for releasably securing said fourth plate portion and said second surface together so as to clamp said flange of said other of said panels therebetween.

2. The modular panel assembly of claim 1 wherein first gasket means separate the upper surface of said flange of said one of said panels from said second plate portion, and second gasket means separate the upper surface of said flange of said other of said panels from said fourth plate portion.

3. The modular panel assembly of claim 2 wherein said first and second gasket means each comprise a strip of sound absorbing material.

4. The modular panel assembly of claim 2 wherein a first gasket of sound absorbing material is located at the bottom of said channel of said one of said panels in sealing engagement with the tongue, the adjacent edge of said body of said one of said panels, and said first plate portion, and a second gasket of sound absorbing material is located at the bottom of said channel of said other of said panels in sealing engagement with the tongue, the adjacent edge of said body of said other of said panels and said third plate portion.

5. The modular panel assembly of claim 1 wherein said second body portion defines a third surface to said first engaging the tongue of said one of said panels, and a fourth surface engaging the tongue of said other one of said panels.

6. The modular panel assembly of claim 1 wherein said second body portion is a thin-walled structure defining a central cavity.

7. The modular panel assembly of claim 6 wherein said central cavity is substantially totally filled with sound absorptive material.

8. The modular panel assembly of claim 1 wherein said flat body is a thin walled structure defining a central cavity.

9. The modular panel assembly of claim 1 wherein said central cavity is substantially totally filled with sound absorptive material.

10. The modular panel assembly of claim 1 wherein:
(a) said panels further comprise an outer wall, an inner wall, and edge walls defining an enclosed cavity substantially totally filled with sound absorptive material, said at least one flange-carrying tongue being integrally formed with said outer wall, and said outer wall, said tongue and said flange all being made of a material resistant to the passage of electrical radiation therethrough;
(b) said second and said third connectors are made of a material resistant to the passage of electrical radiation therethrough;
(c) a first gasket means resistant to the passage of both sound and electrical radiation therethrough separates the upper surface of said flange associated with said one of said panels and said second plate portion of said second connector, and second gasket means resistant to the passage of both sound and electrical radiation therethrough separates the upper surface of the flange associated with said other one of said panels and said fourth plate portion of said third connector;
(d) shield means resistant to the passage of electrical radiation extends between said first surface and said second surface, said shield means carrying a second flange clamped between said first surface and said second plate portion of said second connector and a third flange clamped between said second surface and said fourth plate portion of said third connector; and
(e) said first connector comprising a thin walled body defining a central cavity substantially totally filled with sound absorptive material.

11. The modular panel assembly of claim 10 wherein said first and second gasket means each comprise a strip of sound absorptive foam located in abutting relation to a strip of highly conductive metallic mesh, the thickness of said foam and said mesh being substantially equal.

12. The modular panel assembly of claim 10 wherein said inner wall and said edge walls of said panels, and the walls of said first connector, are made of lightweight material.

13. The modular panel assembly of claim 12 wherein the lightweight material is aluminum.

14. The modular panel assembly of claim 10 wherein the material resistant to the passage of electrical radiation therethrough is galvanized steel.

15. The modular panel assembly of claim 10 wherein the inner wall of the panels is substantially transparent to the passage of sound therethrough.

16. The modular panel assembly of claim 15 wherein the inner wall is made of perforated aluminum.

17. A method for joining modular panel portions at an angle to each other comprising:
(1) providing at least two panels each including a substantially flat body, a tongue at at least one edge of each said body extending substantially parallel to and spaced from said body so as to form a channel therebetween, and a flange portion carried by each said tongue and extending a predetermined distance away from its associated channel, said flange portions each having an upper surface and a lower surface,
(2) aligning and orienting each of said panels in one or another plane of a first pair of intersecting planes with each panel having a tongue facing and spaced from said intersection of said planes;
(3) providing a first connector having a body portion defining first and second surfaces located in one or another plane of a second pair of intersecting planes, said first and second surfaces having a width greater than said predetermined distance, and the angle of intersection of said second pair of intersecting planes being substantially the same as the angle of intersection of said first pair of intersecting planes;
(4) locating said first connector between said panels, with said first surface engaging the lower surface of the flange associated with one of said panels and the second surface engaging the lower surface of the flange associated with the other of said panels;
(5) providing a second connector having a substantially L-shaped cross-section including a first plate portion and a second plate portion, said second plate portion having a width substantially greater than said predetermined distance, but less than the width of said first surface, and providing a third connector having a substantially L-shaped cross-section including a third plate portion and a fourth plate portion, said fourth plate portion having a width substantially greater than said predetermined distance, but less than the width of said second surface;

(6) inserting said first plate portion of said second connector into said channel associated with said one of said panels such that said second plate portion extends over the upper surface of the flange associated with said one of said panels, and inserting said third plate portion of said third connector into the channel associated with said other of said panels such that said fourth plate portion of said third connector extends over the upper surface of said flange associated with the other of said panels; and, (7) releasably securing said second plate portion to said first surface, and said fourth plate portion to said second surface.

18. The method of claim 17 including the step of providing a gasket between the upper surface of each said flange and the second portion of said second connector and the fourth portion of said third connector, respectively.

19. The method of claim 18 wherein said gasket is made of sound absorbent material.

20. The method of claim 18 wherein said gasket comprises a strip of sound absorbent material located adjacent to a strip of material resistant to the passage of electrical radiation therethrough, said strips being of substantially equal thickness.

21. The method of claim 17 wherein:

said panels further comprise an outer wall, an inner wall, and edge walls defining an enclosed cavity substantially totally filled with sound absorptive material, said at least one flange-carrying tongue is integrally formed with said outer wall, and said edge walls, said outer wall, said tongue and said flange are all made of a material resistant to the passage of electrical radiation therethrough, wherein said second and said third connectors are made of a material resistant to the passage of electrical radiation therethrough, and wherein said first connector comprises a thin walled body defining a central cavity substantially totally filled with sound absorptive material;

said method including the additional steps of:

providing first gasket means resistant to the passage of both sound and electrical radiation therethrough between the upper surface of said flange associated with said one of said panels and said second plate portion of said second connector, and second gasket means resistant to the passage of both sound and electrical radiation therethrough between the upper surface of the flange associated with said other one of said panels and said fourth plate portion of said third connector; and providing shield means resistant to the passage of electrical radiation conforming with the exterior contour of said first connector between said first surface and said second surface, said shield carrying first and second mounting flanges on opposite edges thereof; and clamping said mounting flanges respectively between said first surface and said second plate portion of said second connector, and between said second surface and said fourth plate portion of said third connector.

22. A modular enclosure including at least three walls aligned and oriented in separate planes comprising:

(a) a framework surrounding the edges of said walls, said framework including at least three first support means located respectively at the intersection of the planes of each pair of said walls, each of said first support means comprising an elongated body located substantially along the intersection of the planes of adjacent walls and defining first and second spaced longitudinal surfaces, said first surface extending along a first portion of said body facing one of said adjacent walls and the second surface extending along a second portion of said body facing the other of said adjacent walls;

(b) at least three wall panels each including a substantially flat body, a tongue at at least two opposite edges of each said body extending substantially parallel to and spaced from said body so as to form a channel therebetween, and a flange portion carried by each said tongue extending a predetermined distance away from said channel, said flange portions each having an upper surface and a lower surface, and said panels being aligned and oriented in the planes of said walls with the lower surfaces of the flanges of the tongues associated with opposite edges of the panels engaging the first surface of one of said first support means and the second surface of another of said first support means, respectively;

(c) first and second connectors associated with each said first support means, each of said first and second connectors having a substantially L-shaped cross-section and including a first plate portion and a second plate portion, said second plate portions having a width substantially greater than said predetermined distance, but less than the width of said first and second surfaces, said first plate portions of said first and second surfaces, said first plate portions of said first connectors extending respectively within the channels formed by the tongues carrying the flanges engaging the first surface of each first support means so as to make a snug fit between the adjacent tongue and panel edge, and the second plate portions of said first connectors extending from said first plate portions of said first connectors respectively over the upper surfaces of said flanges engaging said first surfaces, and said first plate portions of said second connectors extending respectively within the channels formed by the tongues carrying the flanges engaging the second surface of each first support means so as to make a snug fit between the adjacent tongue and panel edge, and said second plate portions of said second connectors extending respectively from said first plate portions of said second connectors over the upper surface of said flanges engaging said second surfaces; and (d) attachment means for affixing said first and second connectors to said first support means.

23. The enclosure of claim 22 comprising four walls.

24. The enclosure of claim 22 comprising six walls.

25. The enclosure of claim 24 wherein said six walls are arranged and oriented in the shape of a cube.

26. The enclosure of claim 22 wherein said framework further comprises at least one second support means parallel to and located between at least one pair of said first support means, and wherein said wall between said at least one pair of first support means comprises at least two panels joined at said second support means.

27. The enclosure of claim 26 wherein said at least one second support means comprises two parallel spaced apart side plates and a web connecting and supporting said side plates, the side plates extending between and making a snug fit with the tongues associated with the edges of the panels adjacent to the second support means;

wherein a third connector including two spaced apart side plates connected to and supported by a web portion is located such that said side plates respectively extend within the channels of said panels adjacent to said second support means in a snug fitting relation between the respective panels and tongues; and wherein means associated with said second support means and said third connector releasably secure said second support means and said third connector together, thereby clamping the flanges extending from the tongues of the panels adjacent to the second support means therebetween.

* * * * *

UNITED STATES PATENT AND TRADEMARK OFFICE
CERTIFICATE OF CORRECTION

PATENT NO.   :   5,260,525
DATED        :   November 9, 1993
INVENTOR(S)  :   Jeffrey L. Morse It is certified that error appears in the above-indentified patent and that said Letters Patent is hereby corrected as shown below:

column 5, line 29, the word "a" should be deleted and the word -- an -- inserted;

Claim 1, column 8, line 37, the word "form" should be deleted and the word -- from -- inserted;

Claim 1, column 8, line 44, the word "form" should be deleted and the word -- from -- inserted;

Claim 5, column 9, lines 37 and 38, the phrase "to said first" should be deleted; and Claim 22, column 12, lines 43 and 44, the phrase "said first and second surfaces, said first plate portions of" should be deleted.

Signed and Sealed this

Tenth Day of May, 1994

*Attest:*

BRUCE LEHMAN

*Attesting Officer*     *Commissioner of Patents and Trademarks*